United States Patent [19]

Hashimoto

[11] Patent Number: 5,005,046
[45] Date of Patent: Apr. 2, 1991

[54] PATTERN FORMING METHOD
[75] Inventor: Koichi Hashimoto, Yokohama, Japan
[73] Assignee: Fujitsu Limited, Kawasaki, Japan
[21] Appl. No.: 496,010
[22] Filed: Mar. 20, 1990
[30] Foreign Application Priority Data
  Mar. 20, 1989 [JP] Japan .................................. 1-68306
[51] Int. Cl.$^5$ ............................................. G03B 27/42
[52] U.S. Cl. ......................................... 355/77; 355/53
[58] Field of Search .................................... 355/53, 77
[56] References Cited

U.S. PATENT DOCUMENTS 4,704,027 11/1987 Phillips .................................. 355/53
4,861,162 8/1989 Ina et al. .............................. 355/53
4,933,715 6/1990 Yamada et al. ....................... 355/53

FOREIGN PATENT DOCUMENTS 35693 8/1986 Japan .

Primary Examiner—Monroe H. Hayes
Attorney, Agent, or Firm—Staas & Halsey

[57] ABSTRACT

A method for forming patterns includes the steps of forming a first layer presenting at least one first alignment mark on a substrate and forming a second layer presenting at least one first pattern and two alignment marks on top of the first layer. The alignment marks of the second layer are independently aligned relative to the first alignment mark. The positions of the alignment marks of the second layer are measured and the deviations of such marks from preselected design positions are calculated. The substrate is moved to a corrected position determined from the calculated deviations. Finally a third layer which includes at least one second main pattern is formed on the second layer by aligning the second main pattern with the second alignment marks.

15 Claims, 7 Drawing Sheets

FIG. 1 PRIOR ART
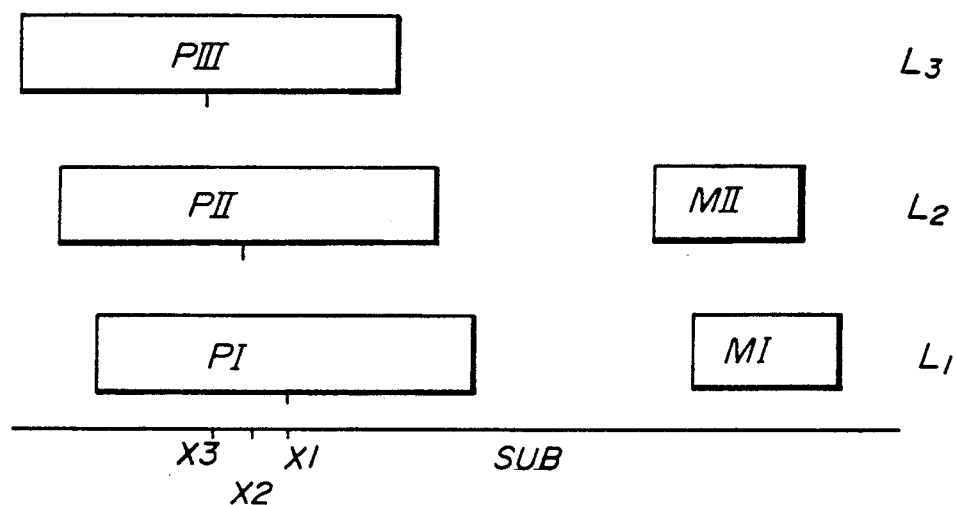
FIG. 3A  FIG. 3B
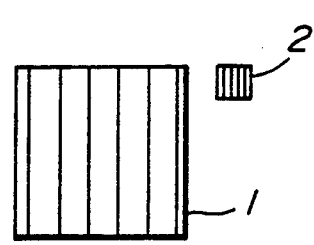 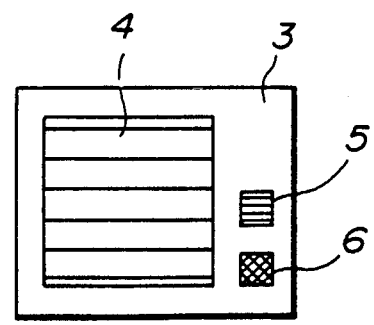

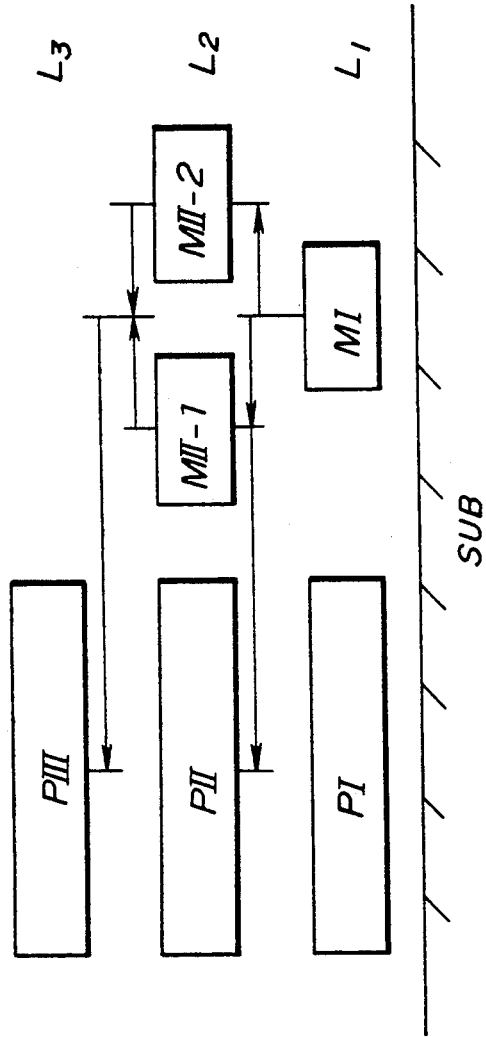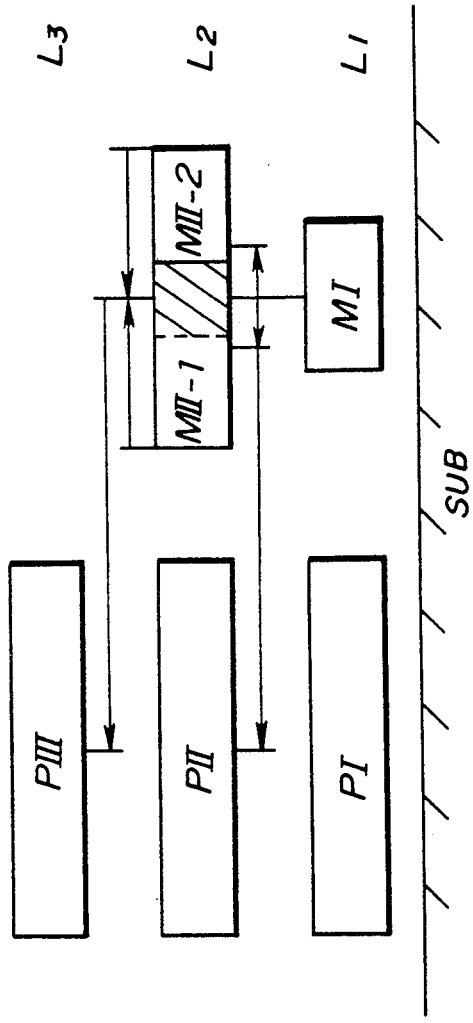

PATTERN FORMING METHOD

BACKGROUND OF THE INVENTION

The present invention generally relates to pattern forming methods in which a plurality of patterns are successively overlapped and exposed on a substrate, and more particularly to a pattern forming method which uses a multi-level alignment and is suited for application to semiconductor device production which requires high accuracy.

Recently, the use of semiconductor integrated circuits is rapidly increasing and there is a strong demand to improve the integration density of the semiconductor integrated circuits. In order to meet this demand, there is active research and development in photolithography techniques. Accurate alignment techniques are very important in determining integration density improving the resolution by way of which fine patterns are formed.

According to conventional techniques, a lower layer which is the subject of the alignment is formed on a substrate and a photoresist layer is formed on this lower layer. Thereafter, a main pattern and an alignment mark pattern are simultaneously exposed so as to form on the lower layer the main pattern and a set of alignment marks which have a fixed positional relationship to the main pattern. Then, an upper layer which is to be aligned and a photoresist layer are formed on the lower layer. The positions of the alignment marks on the lower layer are measured, and a mask for the upper layer is exposed after moving the substrate so that the positions of the alignment marks match predetermined fixed positions relative to the mask. When forming a multi-level pattern, the above described procedure is repeated to successively make the alignment.

The accuracy of conventional alignment techniques may be unclustered by referring to FIG. 1. For the sake of convenience, the accuracy of conventional techniques will be explained in connection with a one-dimensional, alignment, however, a similar phenomena of course occur in the case of two-dimensional alignments. A layer which is the subject of the process and a photoresist layer are combined and referred to as a first layer, and an nth layer will be denoted by the designation Ln. Three layers L1 through L3 are successively exposed in this example. Of course, the example is not limited to exposure by a light and the exposure may be made by an electron beam or the like.

First, the first layer L1 is formed and a pattern PI and an alignment mark MI are formed as part of the first later L1 A coordinate of a reference point on the first layer L1 is denoted by X1. A formed, a mask for the second layer L2 is aligned with alignment mark MI of the first layer L1 and this mask is exposed to form a second layer L2 on layer L1. A reference point on the second layer L2 is denoted by X2. When normal alignment techniques used in this way, the reference point X2 of the second layer L2 has an average value which is by approximation equal to the reference point X1 of the first layer L1 and is a random variable in conformance with a normal distribution of a variance $d_2^2$. Next, a mask for the third layer L3 is aligned with the alignment mark MII of the second layer L2 and this mask is exposed to thus form layer L3. A reference point on the third layer L3 is denoted by X3. The reference point X3 of the third layer L3 has an average value which is by approximation equal to the reference point X2 of the second layer L2 and is a random variable in conformance with a normal distribution of a variance $d_3^2$.

The variance of the positional error X1-X2 between the layers L1 and L2 is expressed as the $d_2^2$, and variance of the positional error X2-X3 between the layers L2 and L3 is expressed as $d_3^2$. The variance of the positional error between the layers L1 and L3 thus becomes $d_2^2 + d_3^2$. This variance $d_2^2 + d_3^2$ of the positional error between the layers L1 and L3 has a great deteriorating effect on the alignment accuracy in connection with so-called indirect alignment.

According to conventional alignment techniques, indirect alignment accuracy deteriorates as the distance between the two layers increases during the alignment sequence. Positional error between layers is a serious problem for semiconductor devices having complex structures. For this reason, the patterns of semiconductor devices must be laid out to include margins which take into account the alignment error, but these measures alignment error prevents further improvement of the integration density of the semiconductor device.

SUMMARY OF THE INVENTION

Accordingly, it is a general object of the present invention to provide a novel and useful pattern forming method in which the problems described above are eliminated.

Another and more specific object of the present invention is to provide a pattern forming method comprising the steps of forming a first layer which includes at least one first alignment mark on a substrate, forming a second layer which includes at least one first pattern and second and third alignment marks on the first layer. The second and third alignment marks are independently aligned with the first alignment mark. The method includes the step of measuring the positions of the second and third alignment marks and calculating the deviations of said positions from predetermined design positions. The substrate based is then moved to a corrected location determined from the calculated deviations. A third layer which includes at least one second pattern is then formed on the second layer by aligning the second pattern with the second alignment marks. According to the pattern forming method of the present invention, it is possible to improve indirect alignment accuracy while balancing direct and indirect alignment accuracies if needed. For this reason, it is possible to considerably improve integration density of the semiconductor devices.

Other objects and further features of the present invention will be apparent from the following detailed description when read in conjunction with the accompanying drawings.

BRIEF DESCRIPTION OF THE DRAWINGS

FIG. 1 is a diagram explaining an example of a conventional alignment technique;

FIGS. 2A through 2D are diagrams explaining the operating principles of a pattern forming method according to the present invention;

FIGS. 3A through 3F are diagrams explaining a first embodiment of a pattern forming method according to the present invention;

DESCRIPTION OF THE PREFERRED EMBODIMENTS

Figure 2C:
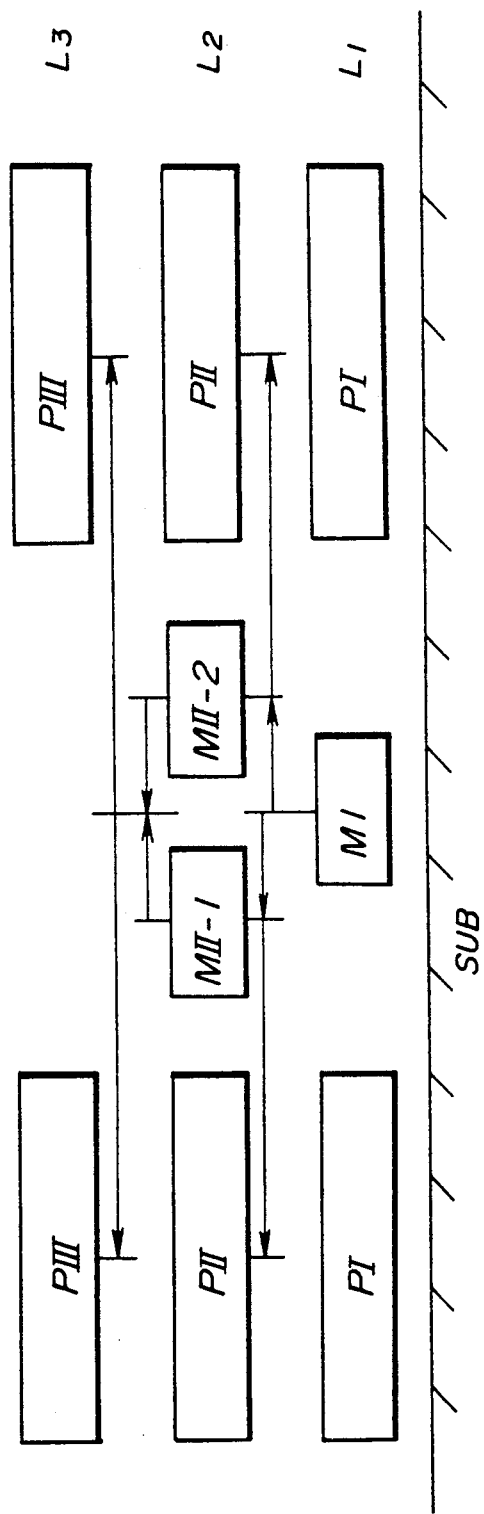

First, the operating principles of a pattern forming method according to the present invention, will be described by referring to FIGS. 2A through 2D which illustrated a typical case.

In FIG. 2A, a main pattern PI and an alignment mark MI are formed as part of a first layer L1 on a substrate SUB. When forming patterns in a second layer L2, a main pattern PII and a first alignment mark MII-1 of the second layer L2 are aligned with the alignment mark MI of the first layer L1 and exposed. In addition, a second alignment mark MII-2, which is located at a position independent of the first alignment mark MII-1, is aligned with the alignment mark MI of the first layer L1 and exposed at least once. Hence, a plurality of alignment marks MII-1 and MII-2 are formed in the second layer L2. The positions of the alignment marks MII-1 and MII-2 are measured and deviations from respective designed values are calculated. The substrate SUB is moved to a corrected location based on the calculated deviations so as to align a third layer L3 with the second layer L2.

In FIG. 2B, those parts which are essentially the same as those corresponding parts in FIG. 2A are designated by the same reference numerals, and further description thereof will be omitted. In the case shown in FIG. 2B, the main pattern PII and the first alignment mark MII-1 of the second layer L2 are aligned with the alignment mark MI of the first layer L1. Then, the second alignment mark MII-2 of the second layer L2 is aligned with the alignment mark MI of the first layer L1 and exposed at least once so that the second alignment mark MII-2 partially overlaps the first alignment mark MII-1. A reference position is obtained by measuring the positions of the ends of the partially overlapping alignment marks MII-1 and MII-2, and the deviation of the reference position from a predetermined design position is calculated. The substrate SUB is moved based on the calculated error so as to align the third layer L3 with the second layer L2.

In the case shown in FIG. 2C, main patterns are formed on both sides of the respective alignment marks. Otherwise, FIG. 2C is basically the same as FIG. 2A.

Figure 2D:
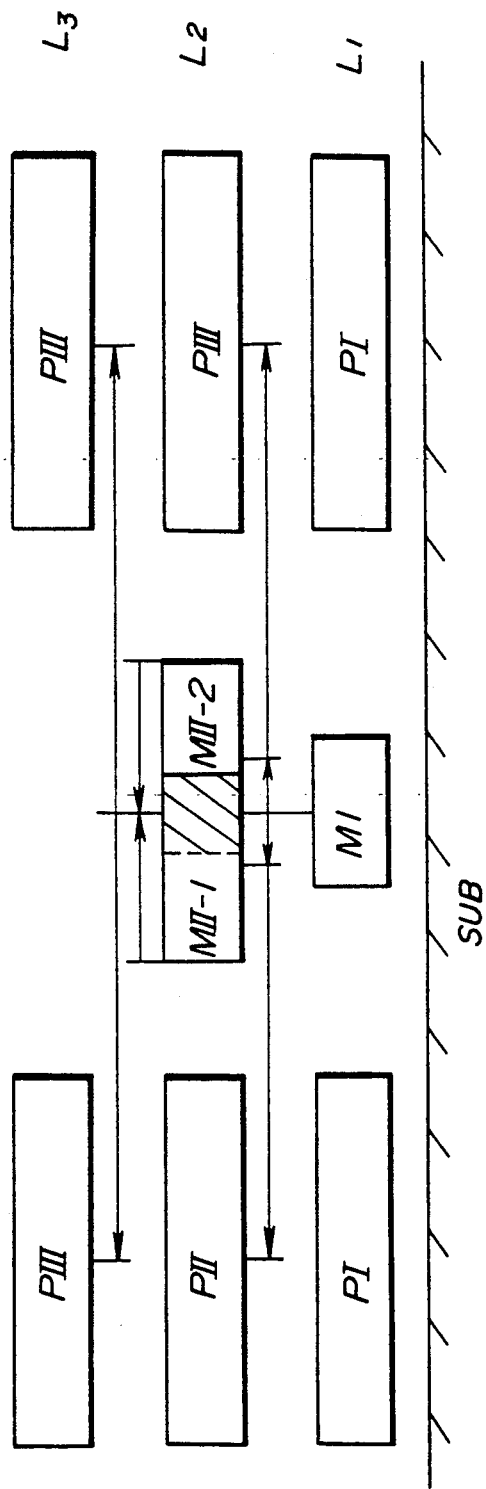

In the case shown in FIG. 2D, main patterns are formed on both sides of the respective alignment marks. Otherwise, FIG. 2D is basically the same as FIG. 2B.

According to present invention, the indirect alignment accuracy is improved in the following manner. For the sake of simplifying the description, a description will be given of the one-dimensional alignment accuracy of the three layers L1 through L3 in the case shown in FIG. 2A.

The variance $d^2$ of the positional error is composed of two factors, that is, $d^2 = dmes^2 + dmov^2$, where $dmes^2$ denotes errors in measurement of the alignment mark position and $dmov^2$ denotes errors between a desired degree of movement which is calculated from the measured result and the actual degree of movement.

First, the main pattern PI and the alignment mark MI are formed as part of the first layer L1. The alignment mark MI itself is the same as the alignment mark MII of the conventional case shown in FIG. 1. A coordinate of a reference point on the first layer L1 is denoted by X1.

The main pattern PII and the first alignment mark MII-1 of the second layer L2 are aligned with the alignment mark MI of the first layer L1 and exposed. A reference point X21 of the main pattern PII and the first alignment mark MII-1 has an average X1 and a variance $d_2^2 = dmes_2^2 + dmov_2^2$. In addition, the second alignment mark MII-2 of the second layer L2 is aligned with the alignment mark MI of the first layer and exposed. A reference point X22 of the second alignment mark MII-2 has an average X1 and a variance $d_2^2$. Because the alignment and exposure of the alignment marks MII-1 and MII-2 are carried out independently, X21 and X22 become substantially independent random variables.

Next, the third layer L3 is aligned with the second layer L2. The reference coordinate which is obtained by measuring the position of the first alignment mark MII-1 of the second layer L2 has an average X21 and a variance $dmes_3^2$ when it is assumed that the true position of X21 is X21. Similarly, the reference coordinate which is obtained by measuring the position of the second alignment mark MII-2 of the second layer L2 has an average X22 and a variance $dmes_3^2$.

When the measured positions are averaged, the average is $(X21+X22)/2$ and the variance becomes $dmes_3^2/2$.

When the third layer L3 is aligned based on the position information which is obtained in the above described manner, a reference point X3 on the third layer L3 has an average $(X21+X22)/2$ and a variance $d_3'^2 = dmes_3^2/2 + dmov_3^2$.

As a result, variance of an error X21-X3 between the second and third layers L2 and L3 becomes $d_2^2/2 + d_3'^2$ by considering the independence of X21 and X22 and the error of the average position. A variance of an error X1-X3 between the first and third layers L1 and L3 becomes $d_2^2/2 + d_3'^2$ by considering the independence of X21 and X22. Accordingly, indirect alignment accuracy is improved by $d_2^2/2$ compared to the conventional case.

The factor ½ is the new effect obtained by the present invention. This factor improves the indirect alignment accuracy over the conventional method.

In the above described case, direct alignment accuracy is still deteriorated by $d_2^2/2$ because the described case emphasizes the improvement of indirect alignment accuracy However, it is possible to balance direct alignment and indirect alignment by using a weighted average of the direct and indirect alignments.

The weight of the first alignment mark MII-1 is denoted by w ($0 \leq W \leq 1$) and the weight of the second alignment mark MII-2 is denoted by $(1-w)$. Thus, the weighted average becomes $wX21 + (1-w)X22$. As a result the variance of the error X21-X3 between the second and third layers L2 and L3 becomes $2(1-w)^2 d_2^2 + d_3'^2$, and the variance of the error X1-X3 between the first and third layers L1 and L3 becomes $[(1-w)^2 + w^2]d_2^2 + d_3'^2$. In this case, w=½ is the simple average. It can be seen that direct alignment accuracy improves and indirect alignment accuracy deteriorates as w is increased.

Accordingly, it is possible to realize maximum integration density by simultaneously optimizing the device layout and weighting at the time of averaging. This large freedom of design has not been obtainable in the conventional case.

Two of alignment marks are used in the above described case. But when a plurality (n) alignment marks are used, the variance of the alignment error between the first and third layers L1 and L3 becomes $d_2^2/n + d_3''^2$ and the variance of the alignment error between the second and third layers L2 and L3 becomes $(n-1)d_2^2/n + d_3''^2$, where $d_3''^2 = dmes_3^2/n + dmov_3^2$.

In this case, it is possible to balance direct and indirect alignments by using a weighted average similarly to the above described case. As a result, alignment accuracy as a whole is improved compared to the case where two alignment marks are used.

It is also possible to form another main pattern in combination with alignment marks other than the two alignment marks as shown in FIGS. 2C and 2D.

At the present time, the usage of semiconductor devices is increasing faster than the improvement of the integration density. For this reason, there is a demand for chips which are larger than the limit of the field size of the exposure apparatus. According to one method, the chip is divided into a plurality of fields and exposed But when this method is employed and alignment is made for each field, indirect alignment is required between the fields and there is a problem in that the alignment accuracy deteriorates as the number of layers increases.

On the other hand, methods for independently forming a small region and a larger region on the chip using independent exposure apparatuses are being studied. For example, the region may be is a memory cell array region having a minimum size which is small, and another region may be a peripheral circuit region having a minimum size which is large. In this case, the problem of indirect alignment occurs similarly to the case described above.

Such problems can be overcome as follows. An alignment mark is formed in combination with a plurality of pairs of main patterns, and the average position of the alignment marks on one layer is used as a reference position for the next layer as shown in FIGS. 2C and 2D. As a result, it is possible to improve the alignment accuracy between layers and between fields.

On the other hand, when a positive resist is used in the case shown in FIG. 2B, the first alignment mark MII-1 of the second layer L2 is aligned with the alignment mark MI of the first layer L1 and exposed. Furthermore, the second alignment mark MII-2 of the second layer L2 is aligned with the alignment mark MI of the first layer L1 and exposed. As shown in FIG. 2B, the first and second alignment marks MII-1 and MII-2 partially overlap one other and as a result only an overlap portion indicated by hatchings remains as a mark.

When the center position of the mark which is formed at the overlap portion is measured, this measuring operation become equivalent to measuring $(X21 + X22)/2$ in the first described case. For this reason, it is possible to improve the alignment accuracy similarly to the first described case in which a simple average is used.

On the other hand, when a negative resist is used in the case shown in FIG. 2B, the same effects can be obtained by measuring the center position of the mark which is formed at the overlap portion.

It is also possible to obtain a weighted average by weighting both ends of the mark which is formed at the overlap portion of the first and second alignment marks MII-1 and MII-2.

According to the pattern forming method of the present invention, it is only necessary to provide on each layer one pair of regions for forming the alignment marks. Of course, the deviations in the width of the alignment mark which is exposed must be sufficiently small compared to the required alignment accuracy.

The following is a description of a first embodiment of the pattern forming method according to the present invention, with reference to FIGS. 3A through 3F. Although three or more masks are actually used, it will be assumed for the sake of convenience that the pattern is formed by successively using three masks for one object. The alignment may be made on the same layer or between different layers of a stacked structure of the object.

FIG. 3A shows a pattern which is formed in a first layer formed on a substrate. The pattern includes a main pattern 1 and an alignment mark 2. Only one main pattern 1 and one alignment mark 2 are shown in FIG. 3A, but it is of course possible to provide a plurality of main patterns 1 and a plurality of alignment marks 2, or a plurality of combinations of main patterns 1 and alignment marks 2. It is also possible to omit the main pattern 1. A second layer is formed on the first layer as shown in FIG. 3A, and a positive photoresist layer is formed on the second layer.

FIG. 3B illustrates a first mask 3 for the second layer. This first mask 3 includes a main pattern 4, a first alignment mark 5, and a mask 6 for covering a region to be used later for forming a second alignment mark 8 as described below. The first mask 3 is aligned with the alignment mark 2 on the substrate and the photoresist layer is exposed.

Figure 3C:
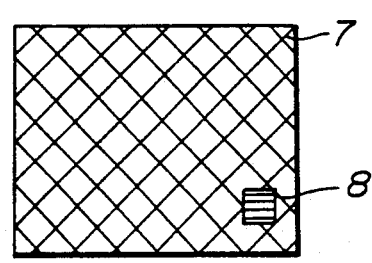

FIG. 3C illustrates a second mask 7. This second mask 7 includes a second alignment mark 8. The second mask 7 is aligned with the alignment mark 2 on the substrate and the photoresist layer is exposed. Then, a developing process is carried out to form a photoresist mask and a process is carried out on the second layer.

Figure 3D:
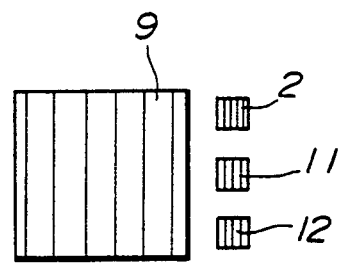

A pattern shown in FIG. 3D is obtained as a result of the process carried out on the second layer. A main pattern 9 and alignment marks 11 and 12 of the second layer are formed as shown in FIG. 3D. FIG. 3D illustrates a case where the alignment mark 2 of the first layer remains on the substrate. Thereafter, a third layer is formed on the substrate and a photoresist layer is formed on the third layer.

Figure 3E:
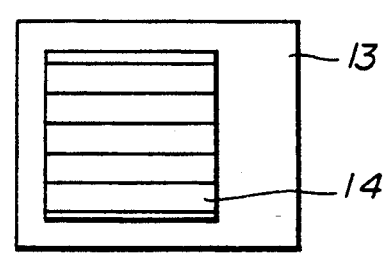

FIG. 3E shows a third mask 13 for the third layer. This third mask 13 includes a main pattern 14. The third mask 13 is aligned and set on an exposure apparatus (not shown), and the positions of the alignment marks 11 and 12 on the substrate are measured. Deviations of the present measured positions from respective designed values are obtained, and the amount of substrate movement necessary to align the object is determined by calculating a simple average or a weighted average of the deviations. The substrate is moved this amount and the alignment is completed. Then the pattern of the third mask 13 for the third layer is exposed and developed, and a process is carried out on the third layer to form the pattern of the third layer.

Figure 3F:
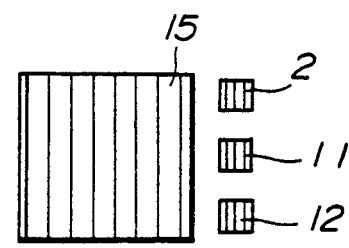

A pattern shown in FIG. 3F is obtained as a result of the process carried out on the third layer. A main pattern 15 is formed on the third layer as shown in FIG. 3F. FIG. 3F also shows the alignment mark 2 of the first layer and the alignment marks 11 and 12 of the second layer.

Next, a description will be given of a second embodiment of the pattern forming method according to the present invention, by referring to FIGS. 4A through 4F.

Figure 4A:
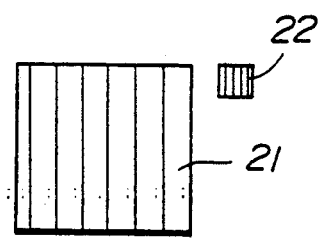
FIGS. 4A through 4F are diagrams explaining a second embodiment of a pattern forming method according to the present invention.

FIG. 4A shows the pattern of a first layer which is formed on a substrate. The pattern includes a main pattern 21 and an alignment mark 22. The main pattern 21 may be omitted. Only one main pattern 21 and one alignment mark 22 are shown in FIG. 4A, but it is of course possible to provide a plurality of main patterns 21 and a plurality of alignment marks 22 or a plurality of combinations of main patterns 21 and alignment marks 22. A second layer is formed on the first layer shown in FIG. 4A, and a photoresist layer is formed on the second layer. For example, a memory region and a peripheral circuit region of one chip are divided and exposed independently for the second and subsequent layers.

Figure 4B:
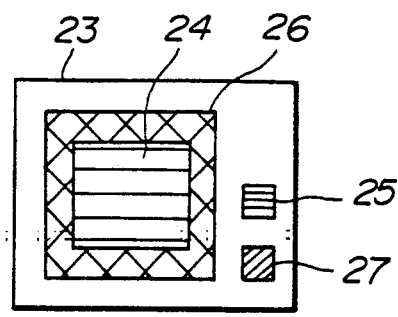
Figure 4C:
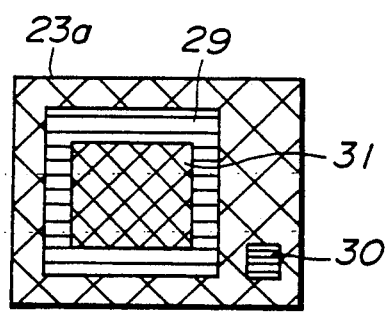

FIGS. 4B and 4C respectively show first and second masks 23 and 23a of the second layer.

FIG. 4B shows the first mask 23 including a first main pattern 24, a first alignment mark 25, a mask 26 of a second main pattern region, and a mask 27 of a second alignment mark region.

FIG. 4C shows the second mask 23a including a second main pattern 29, a second alignment mark 30, and a mask 31 of the first main pattern.

The first mask 23 is aligned with alignment mark 22 on the substrate and exposed. In addition, the second mask 23a is aligned with the alignment mark 22 on the substrate and exposed. Thereafter, the exposed pattern on the substrate is developed.

Figure 4D:
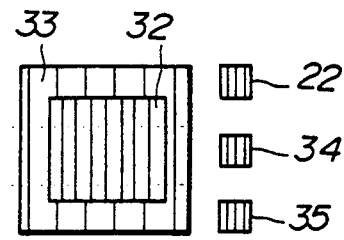

FIG. 4D shows the pattern of the second layer which is obtained by developing the exposed pattern on the substrate. A first main pattern 32 and a second main pattern 33 are formed in FIG. 4D. The second main pattern 33 is formed in a peripheral area of the first main pattern 32. In addition, alignment marks 34 and 35 of the second layers are formed. FIG. 4D also shows the alignment mark 22 of the first layer. Then, a third layer is formed and a photoresist layer is formed on the third layer.

Figure 4E:
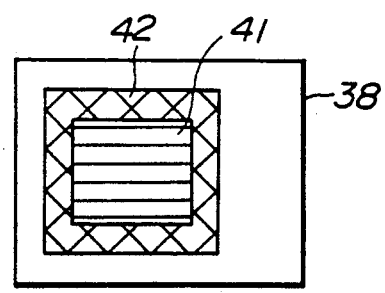
Figure 4F:
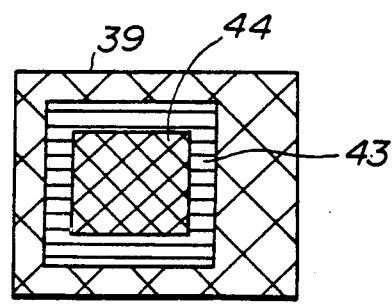

FIGS. 4E and 4F respectively show first and second masks 38 and 39 for the third layer. The first mask 38 includes a first main pattern 41 and a mask 42 for a second main pattern 43. The second mask 39 includes the second main pattern 43 and a mask 44 for the first main pattern 41. The first mask 38 is aligned and set in an exposure apparatus (not shown). Then, the positions of the alignment marks 34 and 35 on the substrate are measured. Deviations of the present measured positions from respective design values are obtained, and the degree of substrate movement necessary for alignment is obtained by calculating a simple average or a weighted average of the deviations. The substrate is moved this moving degree and the first mask 38 is exposed. Next, the second mask 39 is similarly aligned and exposed. After exposing the first and second masks 38 and 39, a developing process is carried out to form the pattern of the third layer.

Next, a description will be given of a third embodiment of the pattern forming method according to the present invention, by referring to FIGS. 5A through 5F.

Figure 5A:
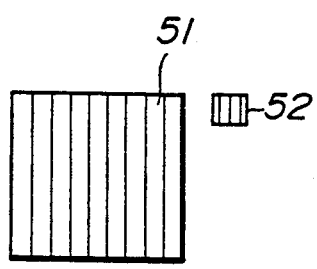
FIGS. 5A through 5F are diagrams explaining a third embodiment of a pattern forming method according to the present invention.

FIG. 5A shows a pattern of a first layer which is formed on a substrate. This pattern includes a main pattern 51 and an alignment mark 52. A second layer is formed on the first layer, and a photoresist layer is formed on the second layer.

Figure 5B:
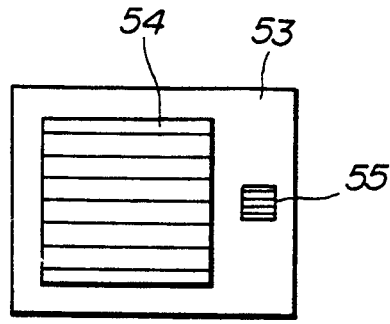

FIG. 5B shows a first mask 53 of the second layer. This first mask 53 includes a main pattern 54 and a first alignment mark 55. The first mask 53 is set and aligned with the alignment mark 52 on the substrate, and a pattern of the second layer is exposed.

Figure 5C:
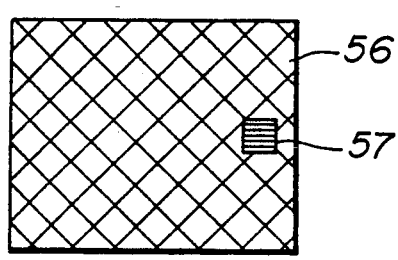

FIG. 5C shows a second mask 56 of the second layer. This second mask 56 includes a second alignment mark 57. The second mask 56 is set and aligned with the alignment mark 52 on the substrate, and a pattern of the second layer is exposed. Next, a developing process is carried out on the pattern of the second layer.

Figure 5D:
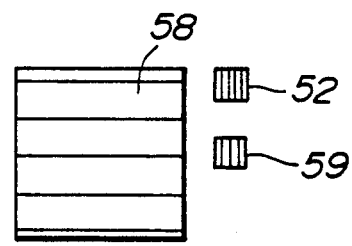

A pattern shown in FIG. 5D is obtained as a result of the developing process which is carried out on the pattern of the second layer. A main pattern 58 and an alignment mark 59 of the second layer are formed as shown in FIG. 5D. The alignment mark 59 is obtained by overlapping the first alignment mark 55 of the first mask 53 and the second alignment mark 57 of the second mask 56. The distance between the two ends of the alignment mark 59 varies depending on the alignment error. In other words, the two ends of the alignment mark 59 are equivalent to two independent alignment marks. In FIG. 5D, the shape of the alignment mark 52 on the first layer is shown to remain. A third layer is formed on the second layer, and a photoresist layer is formed on the third layer.

Figure 5E:
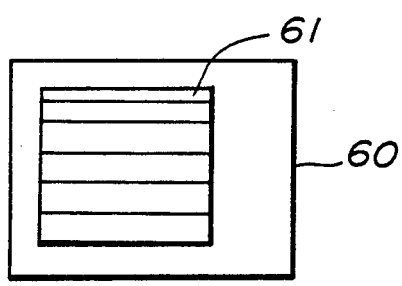

FIG. 5E shows a mask 60 for the third layer. This mask 60 includes a main pattern 61. The mask 60 is set and aligned in an exposure apparatus (not shown). Then, the center position of the alignment mark 59 on the substrate or the weighted center position is measured. The deviation of the present measured center position from the designed value is obtained to calculate the degree of movement needed for alignment. The substrate is moved this amount and the alignment is completed.

Figure 5F:
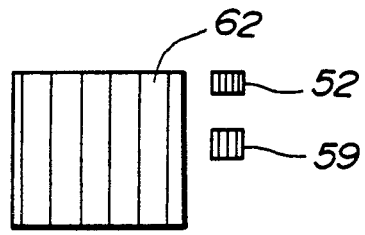

Thereafter, an exposure process and a developing process are carried out to form a pattern in the third layer shown in FIG. 5F. The pattern includes a main pattern 62. FIG. 5F also shows the alignment mark 59 of the second layer and the alignment mark 52 of the first layer.

In the described embodiments, one set of alignment marks is provided for the first layer However, it is possible to provide a plurality of sets of alignment marks for the first layer. In this case, it is possible to reduce the alignment error by aligning the second layer with an average position which is obtained from the plurality of sets of alignment marks.

Although no alignment marks are shown for the third layer in the described embodiments, alignment marks are of course provided for the third layer when fourth and subsequent layers require alignment. For example, two kinds of alignment marks may be provided so that the alignment accuracy can be improved by independently carrying out the exposure.

In addition, although not shown specifically, the alignment marks are generally a combination of various patterns. In other words, the alignment marks in the drawings described above represent such combinations of various patterns.

The embodiments are described for cases where a positive photoresist is used. However, a negative photoresist can be used instead by appropriately modifying the masks.

In the described embodiments, two separate masks are used to form two sets of alignment marks. However, all of the patterns required to carry out the present invention may be formed in a single mask and the desired pattern may then be selected by the exposure apparatus so that only a desired pattern is exposed during each exposure. It is also possible to use a mask with an opening for selecting the required pattern on the single mask which has all of the patterns.

Further, the present invention is not limited to these embodiments, but various variations and modifications may be made without departing from the scope of the present invention.

What is claimed is:

1. A pattern forming method comprising the steps of:
   forming a first layer which includes a first alignment mark on a substrate;
   forming a second layer which includes a first pattern and second and third alignment marks on said first layer, said second and third alignment marks being independently aligned with said first alignment mark;
   measuring the positions of said second and third alignment marks and calculating the deviations of said positions from predetermined design positions;
   moving the substrate to a correct location determined from the calculated deviations; and
   forming a third layer which includes a second pattern on said second layer by aligning said second pattern with said second and third alignment marks.

2. The pattern forming method as claimed in claim 1 wherein said step of forming said second layer includes the steps of aligning said first pattern and said second alignment mark with said first alignment mark, exposing said first pattern and said second alignment mark, aligning said third alignment mark with said first alignment mark, exposing said third alignment mark, and developing said first pattern and said second and third alignment marks.

3. The pattern forming method as claimed in claim 2 wherein said first pattern and said second alignment mark are simultaneously exposed.

4. The pattern forming method as claimed in claim 1 wherein said corrected location is based on a simple average of the calculated deviations.

5. The pattern forming method as claimed in claim 1 wherein said corrected location is based on a weighted average of the calculated deviations.

6. The pattern forming method as claimed in claim 1 wherein said second layer is formed to include at least two first patterns.

7. The pattern forming method as claimed in claim 6 wherein said forming step includes the step of exposing said two first patterns independently.

8. The pattern forming method as claimed in claim 1 wherein said first layer is formed to include at least one pattern.

9. The pattern forming method as claimed in claim 1 wherein said second and third alignment marks are formed so as to partially overlap one another to present an overlap portion.

10. The pattern forming method as claimed in claim 9 wherein said measuring step includes the measurement of the positions of the opposite ends of said overlap portion.

11. The patter forming method as claimed in claim 9 wherein aid second layer is formed to include at least two first patterns.

12. THe pattern forming method as claimed in claim 11 wherein said forming step includes the step of exposing said two first patterns independently.

13. The pattern forming method as claimed in claim 1 wherein the variance in alignment error between said second and third layers is $d_2^2/2 + d_3'^2$ and the variance in alignment between error between said first and third layers is $d_2^2/2 + d_3'^2$ denotes the variance of a reference point of one of said second and third alignment marks and $d_3'^2$ denotes the variance of a reference point of said third layer.

14. The pattern forming method as claimed in claim 1 wherein said second layer is formed to include a plurality of second alignment marks.

15. The pattern forming method as claimed in claim 14 wherein the variance in alignment error between said second and third layers is $(n-1)\,d_2^2/n + d_3''^2$ and the variance in alignment error between said first and third layers is $d_2^2/n + d_3''^2$, where n denotes the number of said second alignment marks, $d_2^2$ denotes the variance of a reference point of a given second alignment mark and $d_3''^2$ denotes the variance of a reference point of said third layer.

* * * * *

UNITED STATES PATENT AND TRADEMARK OFFICE
CERTIFICATE OF CORRECTION

PATENT NO. : 5,005,046
DATED : April 2, 1991
INVENTOR(S) : KOICHI HASHIMOTO

It is certified that error appears in the above-identified patent and that said Letters Patent is hereby corrected as shown below:

Column 1, line 37, "unclustered" should be --understood--;
line 40, "dimensional," should be --dimensional--;
line 51, "later L1 A" should be --layer L1.  A--;
line 52, delete "formed, a";
line 57, "techniques used" should be --techniques are used--.

Column 2, line 5, "and vari-" should be --and the vari---;
line 21, "sures" should be --sures to combat--;
line 25, "Accordingly, it" should be --It--.

Column 4, line 47, "accuracy However" should be --accuracy.  However--;
line 51, "W" should be --w--;
line 53, "1-w)" should be --(1-w)--;
line 67, delete "of".

Column 5, line 19, "exposed" should be --exposed.--;
line 28, delete "is".

Column 8, line 41, "layer However" should be --layer.  However--.

Column 10, line 6, "independently ." should be --independently.--;
line 19, "aid" should be --said--;
line 21, "THe" should be --The--;

UNITED STATES PATENT AND TRADEMARK OFFICE
CERTIFICATE OF CORRECTION

PATENT NO. : 5,005,046

DATED : April 2, 1991

INVENTOR(S) : KOICHI HASHIMOTO

It is certified that error appears in the above-identified patent and that said Letters Patent is hereby corrected as shown below:

Column 10, line 28, "denotes" should be --where $d_2^2$ denotes--;

Signed and Sealed this

Eighth Day of September, 1992

*Attest:*

DOUGLAS B. COMER

*Attesting Officer*     *Acting Commissioner of Patents and Trademarks*